(12) United States Patent
Brick et al.

(10) Patent No.: US 11,133,446 B2
(45) Date of Patent: Sep. 28, 2021

(54) OPTOELECTRONIC COMPONENT

(71) Applicant: OSRAM OLED GmbH, Regensburg (DE)

(72) Inventors: Peter Brick, Regensburg (DE); Stefan Groetsch, Bad Abbach (DE); Simon Schwalenberg, Brennberg (DE); Michael Wittmann, Alteglofsheim (DE)

(73) Assignee: OSRAM OLED, Regensburg (DE)

( * ) Notice: Subject to any disclaimer, the term of this patent is extended or adjusted under 35 U.S.C. 154(b) by 88 days.

(21) Appl. No.: 16/626,355

(22) PCT Filed: Jun. 26, 2018

(86) PCT No.: PCT/EP2018/000319
§ 371 (c)(1),
(2) Date: Dec. 24, 2019

(87) PCT Pub. No.: WO2019/001767
PCT Pub. Date: Jan. 3, 2019

(65) Prior Publication Data
US 2020/0119242 A1    Apr. 16, 2020

(30) Foreign Application Priority Data
Jun. 28, 2017 (DE) .................... 10 2017 114 369.6

(51) Int. Cl.
*H01L 33/58* (2010.01)
*H01L 27/15* (2006.01)
(Continued)

(52) U.S. Cl.
CPC ............ *H01L 33/58* (2013.01); *H01L 27/156* (2013.01); *H01L 33/145* (2013.01);
(Continued)

(58) Field of Classification Search
CPC ..... H01L 33/58; H01L 33/145; H01L 33/382; H01L 33/44; H01L 33/505; H01L 33/60; H01L 27/156
See application file for complete search history.

(56) References Cited

U.S. PATENT DOCUMENTS

| 4,152,711 A | 5/1979 | Nakata |
| 5,583,351 A | 12/1996 | Brown et al. |

(Continued)

FOREIGN PATENT DOCUMENTS

| DE | 2714682 A1 | 10/1977 |
| DE | 69419451 T2 | 12/1999 |

(Continued)

OTHER PUBLICATIONS

International Search Report based on Application No. PCT/EP2018/000319 (15 pages) dated Sep. 24, 2018 (for reference purpose only).

(Continued)

*Primary Examiner* — Mark W Tornow
(74) *Attorney, Agent, or Firm* — Viering, Jentschura & Partner mbB

(57) ABSTRACT

An optoelectronic component may include an optoelectronic semiconductor chip having an upper side and a lower side. An emitting region may be formed on the upper side. The emitting region may be configured to emit electromagnetic radiation. A subsurface, forming the emitting region, of the upper side may be smaller than a total surface of the upper side. A collimating optical element may be arranged over the emitting region.

14 Claims, 6 Drawing Sheets

(51) Int. Cl.
*H01L 33/14* (2010.01)
*H01L 33/38* (2010.01)
*H01L 33/44* (2010.01)
*H01L 33/50* (2010.01)
*H01L 33/60* (2010.01)

(52) U.S. Cl.
CPC ............ *H01L 33/382* (2013.01); *H01L 33/44* (2013.01); *H01L 33/505* (2013.01); *H01L 33/60* (2013.01)

(56) References Cited

U.S. PATENT DOCUMENTS

| | | | |
|---|---|---|---|
| 6,410,942 B1 * | 6/2002 | Thibeault | H01L 33/08 257/88 |
| 2007/0223219 A1 | 9/2007 | Medendorp, Jr. et al. | |
| 2010/0074293 A1 | 3/2010 | Lochmann et al. | |
| 2010/0295073 A1 | 11/2010 | Groetsch et al. | |
| 2011/0303893 A1 * | 12/2011 | Wagner | H05B 33/10 257/13 |
| 2013/0285103 A1 | 10/2013 | Kim et al. | |
| 2013/0286150 A1 | 10/2013 | Sato et al. | |
| 2014/0023380 A1 | 1/2014 | Takeda et al. | |
| 2014/0152393 A1 | 6/2014 | Motomura et al. | |
| 2015/0071320 A1 | 3/2015 | Gronenborn et al. | |
| 2015/0333109 A1 | 11/2015 | Riegel et al. | |
| 2016/0152175 A1 | 6/2016 | Hwang et al. | |
| 2017/0141538 A1 | 5/2017 | Uchida | |
| 2017/0256691 A1 | 9/2017 | Brick et al. | |

FOREIGN PATENT DOCUMENTS

| | | |
|---|---|---|
| DE | 102005057800 A1 | 6/2007 |
| DE | 102008021572 A1 | 12/2008 |
| DE | 102009025456 A1 | 2/2010 |
| DE | 102007029391 A1 | 3/2010 |
| DE | 102014106952 A1 | 11/2015 |
| DE | 102014113275 A1 | 3/2016 |
| DE | 102015223572 A1 | 6/2016 |
| DE | 102016101872 A1 | 8/2017 |
| EP | 1959529 A2 | 8/2008 |

OTHER PUBLICATIONS

German Search Report based on Application No. 10 2017 114 369.6 (14 pages) dated Apr. 29, 2018 (for reference purpose only).

* cited by examiner

OPTOELECTRONIC COMPONENT

CROSS-REFERENCE TO RELATED APPLICATIONS

The present application is a national stage entry according to 35 U.S.C. § 371 of PCT application No.: PCT/EP2018/000319 filed on Jun. 26, 2018; which claims priority to German Patent Application Serial No. 102017114369.6, which was filed on Jun. 28, 2017; both of which are incorporated herein by reference in their entirety and for all purposes.

TECHNICAL FIELD

The present invention relates to an optoelectronic component as claimed in the independent claim.

BACKGROUND

Optoelectronic components which emit electromagnetic radiation in a defined solid angle are known from the prior art. For example, apertures may be provided in order to suppress a part of a light distribution emitted by an optoelectronic component. The use of projection optics for configuring a light distribution is also known.

SUMMARY

An optoelectronic component is provided.

This object is achieved by an optoelectronic component having the features of the independent claim.

An optoelectronic component includes an optoelectronic semiconductor chip having an upper side and a lower side. An emitting region is formed on the upper side. The emitting region is configured to emit electromagnetic radiation. A subsurface, forming the emitting region, of the upper side is smaller than a total surface of the upper side of the optoelectronic semiconductor chip. A collimating optical element is arranged over the emitting region. Advantageously, the optoelectronic component is configured to emit electromagnetic radiation in a defined solid angle. This is achieved by a combination of a collimating optical element and an emitting region which is limited in its lateral extent, i.e. the subsurface forming the emitting region is smaller than the total surface of the upper side.

In one embodiment, a contact layer is arranged on the upper side or on the lower side. The area covered by the contact layer is substantially as large as the subsurface, forming the emitting region, of the upper side. A lateral position of the area covered by the contact layer is substantially identical to a lateral position of the emitting region. Advantageously, a contact layer which is limited in its lateral extent restricts current paths inside the optoelectronic semiconductor chip. This leads to a lateral restriction of a zone inside the optoelectronic semiconductor chip, in which charge carriers can radiatively recombine. In this way, an emitting region which, in terms of its lateral extent and its lateral position, is substantially identical to the lateral extent and the lateral position of the contact layer is produced on the upper side.

The correspondence of the lateral position and the lateral extent of the contact layer with the lateral position and the lateral extent of the emitting region is intended to be regarded as substantially identical within the scope of production accuracy. Here and in the rest of the context of this description, substantially identical thus means that two values are equal, except for tolerances which result from production inaccuracies.

Production inaccuracies may, for example, result from the fact that current paths inside the optoelectronic semiconductor chip cannot be restricted exactly to the surface covered by the contact layer. Thus, for example, scattering of the charge carriers inside the optoelectronic semiconductor chip may lead to widening of the current paths. It is also possible, for example, that scattering of the electromagnetic radiation, emitted in the course of the recombination of charge carriers, inside the optoelectronic semiconductor chip may lead to widening of the lateral extent of the emitting region relative to the area covered by the contact layer. Furthermore, the lateral extent of the emitting region may depend on an operating temperature or also on an operating voltage of the optoelectronic semiconductor chip. Here and in the rest of the context of the description, the production inaccuracies thus also include systematic deviations of a value, for example of the lateral extent or of the lateral position of the emitting region from the lateral extent or of the lateral position of the area covered by the contact layer.

A difference between a radius of the emitting region and a radius of the area covered by the contact layer may, for example, be 10 µm. This value merely indicates an order of magnitude and is not intended to be restrictive to the subject-matter disclosed herein. Such a difference may be smaller or even greater. The difference may be as small as possible, since this allows better control over the lateral extent of the emitting region. Consequently, the solid angle in which the emitted electromagnetic radiation is intended to be emitted can be controlled better.

In one embodiment, the area covered by the contact layer is raised relative to an uncovered region of the upper side, or of the lower side. A projection, on which the contact layer is arranged, is thus formed on the upper side or on the lower side. Advantageously, current paths inside the optoelectronic semiconductor chip are laterally restricted by a region which is covered by a contact layer and is raised relative to an uncovered region, since charge carriers that are accelerated in the direction of the contact layer must flow through the projection. In this way, the accuracy of the production of the emitting region in respect of its lateral extent and its lateral position may be increased.

In one embodiment, the optoelectronic semiconductor chip includes at least one current path-limiting layer embedded in the optoelectronic semiconductor chip. The current path-limiting layer includes an opening having an opening area. An electrical conductivity of the current path-limiting layer is less than an electrical conductivity of the optoelectronic semiconductor chip in the region of the opening of the current path-limiting layer. This also includes configuring the current path-limiting layer in the form of an insulator. The opening is formed below the emitting region in a vertical direction relative to the upper side. The opening area is substantially as large as the area of the emitting region. Advantageously, current paths inside the optoelectronic semiconductor chip are restricted to the opening of the current path-limiting layer. In this way, the lateral position of the opening and the opening area establish the lateral position and the lateral extent of the emitting region within the limits of production accuracy. The conductivity of the current path-limiting layer may, for example, be reduced by a factor of three relative to the conductivity of the optoelectronic semiconductor chip in the region of the opening of the current path-limiting layer. This configuration of the conductivities is merely exemplary and is not intended to be restrictive to the subject-matter disclosed herein. Other configurations are likewise conceivable. A maximally large difference in the conductivities has the advantage that the effect of the restriction of the current paths to the opening of the current path-limiting layer is more pronounced.

In one embodiment, a wavelength-converting material is arranged over the emitting region. Advantageously, the wavelength-converting material is configured to modify the wavelength of the electromagnetic radiation emitted by the optoelectronic semiconductor chip.

In one embodiment, a nontransparent layer is arranged on the upper side. The nontransparent layer includes an opening over the emitting region. The wavelength-converting material is arranged in the region of the opening.

In one variant, the wavelength-converting material may be arranged only over the emitting region, i.e. only in the opening of the nontransparent layer, so that the limitation of a lateral extent of the wavelength-converting material takes place. This offers the advantage that laterally directed scattering of electromagnetic radiation inside the wavelength-converting material is reduced. Consequently, converted electromagnetic radiation is also emitted substantially over the emitting region. The thinner the wavelength-converting material is configured, the less the lateral scattering of electromagnetic radiation becomes. Furthermore, the nontransparent layer may function as an aperture and impart sharper contours to the emitting region.

In another variant, the wavelength-converting material may also be arranged in such a way that the wavelength-converting material both is arranged over the emitting region and laterally extends partially beyond the emitting region. In this case, a part of the wavelength-converting material in the region of the opening may also be arranged over the nontransparent layer and laterally enclose the opening of the nontransparent layer. This variant offers the advantage that the wavelength-converting material may be arranged simply without regard to the fact that the wavelength-converting material is arranged only over the emitting region.

In one embodiment, the collimating optical element is a lens. Advantageously, the lens may be configured in such a way that it allows emission of electromagnetic radiation in a desired solid angle.

In one embodiment, a lens surface, in contact with the upper side, of the lens is as large or substantially as large as the total surface of the upper side of the optoelectronic semiconductor chip. Advantageously, the lens surface is larger than the subsurface, forming the emitting region, of the upper side. In this way, the lens may collimate all of the electromagnetic radiation which is emitted by the emitting region. Here and in the rest of the context of the description, the lens surface may be considered to be substantially as large as the total surface of the upper side, if a deviation of the lens surface relative to the total surface of the upper side is less than a deviation of the lens surface from the subsurface, forming the emitting region, of the upper side.

In one embodiment, the subsurface, forming the emitting region, of the upper side is at most as large as one fourth of the lens area. Advantageously, when there is such a relationship between the surface of the emitting region and the lens surface, electromagnetic radiation which is emitted by the emitting region is emitted with an aperture angle of 90°. In the context of this description, the aperture angle may be regarded as a full-width half-maximum (FWHM) of an angle-resolved intensity spectrum of a cone of electromagnetic radiation emitted by the emitting region.

In one embodiment, the wavelength-converting material is arranged at a focus of the lens. Advantageously, electromagnetic radiation from the region of the wavelength-converting material is collimated by the arrangement of the wavelength-converting material at the focus of the lens. In this case, both converted electromagnetic radiation and unconverted electromagnetic radiation, which is likewise present because of a finite effective cross section of the conversion, from the region of the wavelength-converting material are collimated.

In one embodiment, the collimating optical element is a reflector. The reflector includes an opening, facing toward the emitting region, having a first radius, an opening, facing away from the emitting region, having a second radius and a height measured perpendicularly to the upper side. The second radius is at most as large as one half of an edge length of an optoelectronic semiconductor chip. Advantageously, a reflector may collimate electromagnetic radiation and offers an alternative to a lens as a collimating optical element. In one particular configuration, the reflector may for example be a parabolically curved reflector.

In one embodiment, the emitting region is configured annularly. Advantageously, an annularly configured emitting region allows laterally directed collimation of electromagnetic radiation.

In one embodiment, the optoelectronic component includes a multiplicity of emitting regions. A collimating optical element is arranged at least over one emitting region. Advantageously, the collimating optical elements may concentrate electromagnetic radiation of each emitting region. A lower overall brightness of an emitting region may therefore be necessary. An operating temperature of the optoelectronic semiconductor chip may consequently be lowered. The lifetime of the optoelectronic semiconductor chip may thus be increased.

In one embodiment, the optoelectronic component includes at least one further optoelectronic semiconductor chip. The further optoelectronic semiconductor chip is configured in the same way as the optoelectronic semiconductor chip.

In one embodiment, in which the optoelectronic component includes a multiplicity of emitting regions, each emitting region may be driven separately. To this end, the optoelectronic semiconductor chip or a multiplicity of optoelectronic semiconductor chips may be arranged on an integrated circuit (IC), the integrated circuit being configured to drive, i.e. to supply with electrical energy for operation, each emitting region separately.

BRIEF DESCRIPTION OF THE DRAWINGS

In the drawings, like reference characters generally refer to the same parts throughout the different views. The drawings are not necessarily to scale, emphasis instead generally being placed upon illustrating the optoelectronic components. In the following description, various aspects are described with reference to the following drawings, in which.

DETAILED DESCRIPTION

Figure 1:
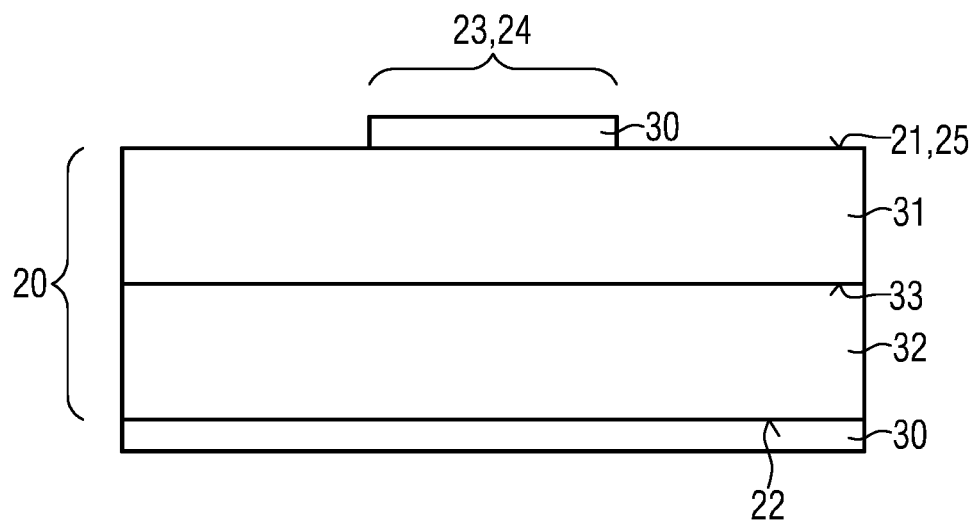
FIG. 1: shows an optoelectronic semiconductor chip having a contact layer restricted in its lateral extent.

FIGS. 6 to 11 show different variants of an optoelectronic component 10. In all these variants, the optoelectronic component 10 includes an optoelectronic semiconductor chip 20. The optoelectronic semiconductor chip 20 may, for example, be a light-emitting diode chip. FIGS. 1 to 4 show different variants of this optoelectronic semiconductor chip 20.

In all variants, the optoelectronic semiconductor chip 20 includes an upper side 21 and a lower side 22. An emitting region 23 is formed on the upper side 21. The emitting region 23 is configured to emit electromagnetic radiation. A subsurface 24, forming the emitting region 23, of the upper side 21 is smaller than a total surface 25 of the upper side 21 of the optoelectronic semiconductor chip 20. Only the subsurface 24, forming the emitting region 23, of the upper side 21 is configured to emit electromagnetic radiation, while the remaining part of the total surface 25 of the upper side 21 is not configured to emit electromagnetic radiation.

FIGS. 1 to 4 represent different possibilities of establishing a lateral position of the emitting region 23 of the optoelectronic semiconductor chip 20 and of restricting its lateral extent. To this end, side views of the optoelectronic semiconductor chip 20 are respectively depicted. First, similarities of the optoelectronic semiconductor chips 50 shown in FIG. 1 to FIG. 4 are elucidated.

The optoelectronic semiconductor chip 20 includes an upper layer 31 and a lower layer 32. The two layers 31, 32 of the optoelectronic semiconductor chip 20 are an n-doped semiconductor layer and a p-doped semiconductor layer. For example, the upper layer 31 may be the n-doped layer and the lower layer 32 may be the p-doped layer. The doping may, however, also be interchanged so that the upper layer 31 has p-doping and the lower layer 32 has n-doping. An interface 33 is formed between the two layers 31, 32. In the vicinity of the interface 33, charge carriers may radiatively recombine with one another inside a space charge zone. It is also conceivable for the optoelectronic semiconductor chip 20 to include a multiplicity of n-doped and p-doped layers 31, 32. In this case, there are a multiplicity of interfaces 33, in the vicinity of which charge carriers may radiatively recombine with one another.

Figure 2:
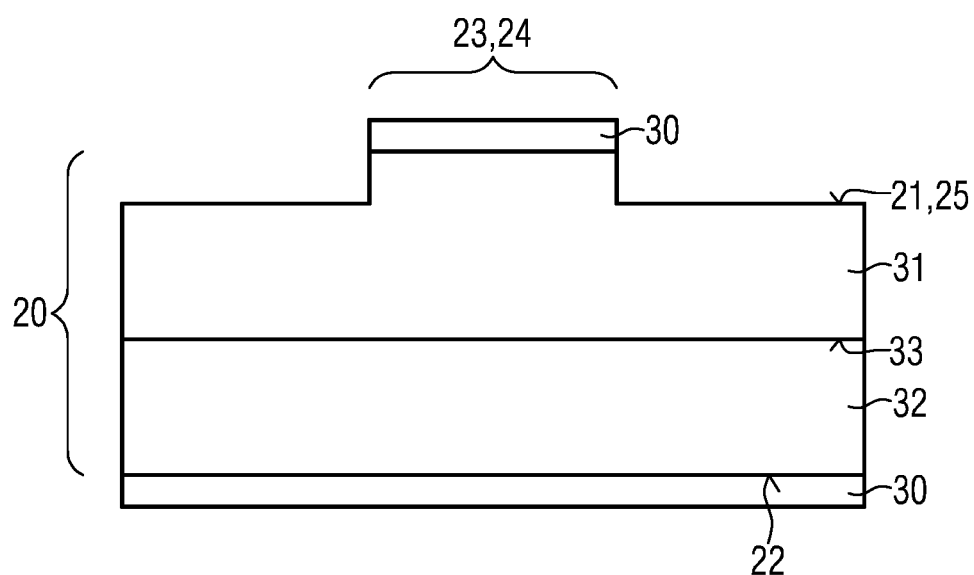
FIG. 2: shows an optoelectronic semiconductor chip, an area covered by a contact layer being raised relative to an uncovered region.
Figure 3:
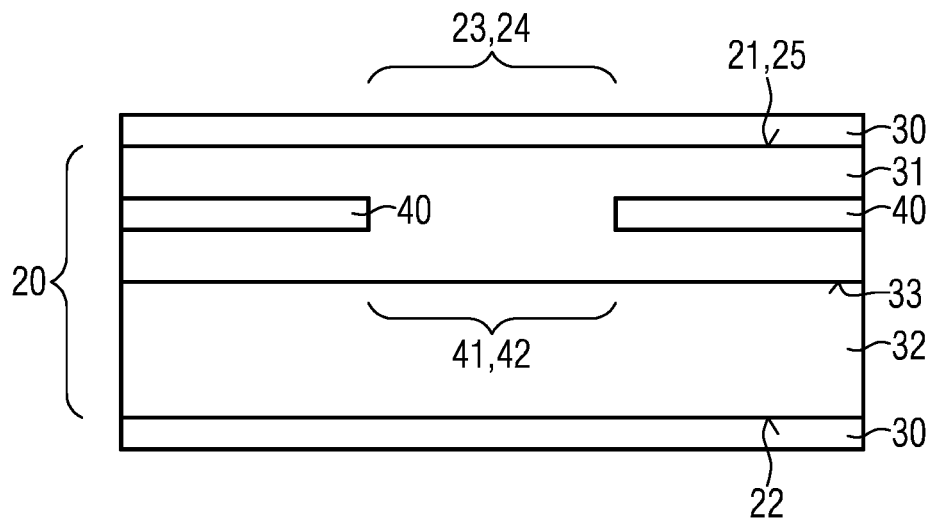
FIG. 3: shows an optoelectronic semiconductor chip having an embedded current path-limiting layer.

For contacting of the upper and of the lower layers 31, 32 of the optoelectronic semiconductor chip 20, as represented in FIG. 1 to FIG. 3, a contact layer 30 is respectively arranged on the upper side 21 and on the lower side 22. The contact layers may, for example, include a metal.

In order to establish a size and a position of the subsurface 24 forming the emitting region 23, current paths inside the optoelectronic semiconductor chip 20 may be influenced. This may be done in various ways.

In FIG. 1, the contact layer 30 arranged on the upper side 21 is limited in its lateral extent, i.e. the contact layer 30 covers a subsurface 24 of the upper side 21. In contrast thereto, the lower contact layer 30 fully covers the lower side 22. Because a contact layer 30 is limited in its lateral extent, current paths inside the optoelectronic semiconductor chip 20 are concentrated substantially onto the contact layer 30 which is limited in its lateral extent. Radiative recombination of charge carriers therefore takes place substantially in a vertical direction below the laterally restricted contact layer 30. The emitting region 23 is consequently formed substantially where the contact layer 30 is arranged on the upper side 21. The lateral extent and the lateral position of the emitting region 23 are thus substantially determined by the lateral extent and the lateral position of the upper contact layer 30 on the upper side 21. The correspondence of the lateral position and the lateral extent of the contact layer 30 with the lateral position and the lateral extent of the emitting region 23 is intended, as already explained above, to be regarded as substantially identical within the scope of the production accuracy.

Expediently, in the event that the contact layer 30 includes a metal, the contact layer 30 may be configured as thinly as possible so that electromagnetic radiation can pass through the contact layer 30 as unimpeded as possible. The contact layer 30 may also be configured to be structured. For example, the contact layer 30 may include a multiplicity of contact rings, which are connected to one another by means of struts. The contact layer 30 may, for example, also be configured as a grid. This has the advantage that electromagnetic radiation can pass unimpeded through meshes of the grid. As an alternative, the contact layer 30 may also include a transparent and electrically conductive material. For example, the contact layer 30 may include indium tin oxide (ITO).

Instead of a limited lateral extent of the contact layer 30 which is arranged on the upper side 21, the contact layer 30 which is arranged on the lower side 22 may also be configured correspondingly. It is also possible to configure both contact layers 30 in such a way that they are limited in their lateral extent.

FIG. 2 represents a further variant, which allows concentration of current paths. In this case, the surface, covered by the contact layer 30, of the upper side 21 is raised relative to a region of the upper side 21 not covered by the contact layer 30. The upper side 21 thus includes a projection on which the contact layer 30 is arranged. Since a flow of charge carriers which flows between the contact layers 30 must flow through the projection, a recombination zone is laterally restricted. Because of this, the emitting region 23 is substantially formed on the projection. As an alternative or in addition, the lower side 22 of the optoelectronic semiconductor chip 20 may also be configured correspondingly. In order to produce projections on an upper side 21 or on a lower side 22 of the optoelectronic semiconductor chip 20, the upper and the lower layers 31, 32 of the optoelectronic semiconductor chip 20 may, for example, be selectively etched. A projection as represented in FIG. 2 is, however, not absolutely necessary and may also be omitted if other measures have been taken to establish the lateral position and the lateral extent of the emitting region 23.

FIG. 3 shows a further variant, which makes it possible to restrict current paths inside the optoelectronic semiconductor chip 20. In this case, a current path-limiting layer 40 embedded in the optoelectronic semiconductor chip 20 is formed. The current path-limiting layer 40 includes an opening 41 having an opening area 42. The opening 41 is formed below the emitting region 23 in a direction perpendicular to the upper side 21 of the optoelectronic semiconductor chip 20. The opening area 42 of the opening 41 is substantially as large as the area of the emitting region 23. The current path-limiting layer 40 may, for example, have an electrical conductivity which is reduced by a factor of three relative to an electrical conductivity of the optoelectronic semiconductor chip 20 in the region of the opening 41 of the current path-limiting layer 40. This makes it possible to concentrate the current paths, which are substantially restricted on the opening area 42. The subject matter disclosed herein is not, however, restricted to such a configuration of the electrical conductivities. Other configurations may also be envisioned. The current path-limiting layer 40 may in this context also therefore be configured as an insulator.

In the example shown in FIG. 3, only the upper layer 31 of the optoelectronic semiconductor chip 20 includes an embedded current path-limiting layer 40. As an alternative or in addition, the lower layer 32 may also include a current path-limiting layer 40. Furthermore, it is possible for the upper layer 31 and/or the lower layer 32 to include a multiplicity of current path-limiting layers 40.

The current path-limiting layer 40 may, for example, be produced by selective oxidation between two growth steps of the layers 31, 32. The current path-limiting layer 40 may also be produced by ion implantation following the growth inside a layer 31, 32. The current path-limiting layer 40 is likewise not absolutely necessary and may be omitted if other measures have been taken to establish the lateral position and the lateral extent of the emitting region 23 (not represented in FIG. 3).

The examples shown in FIG. 1 to FIG. 3 may also be combined with one another in order to achieve maximally efficient concentration of current paths inside the optoelectronic semiconductor chip 20.

Figure 4:
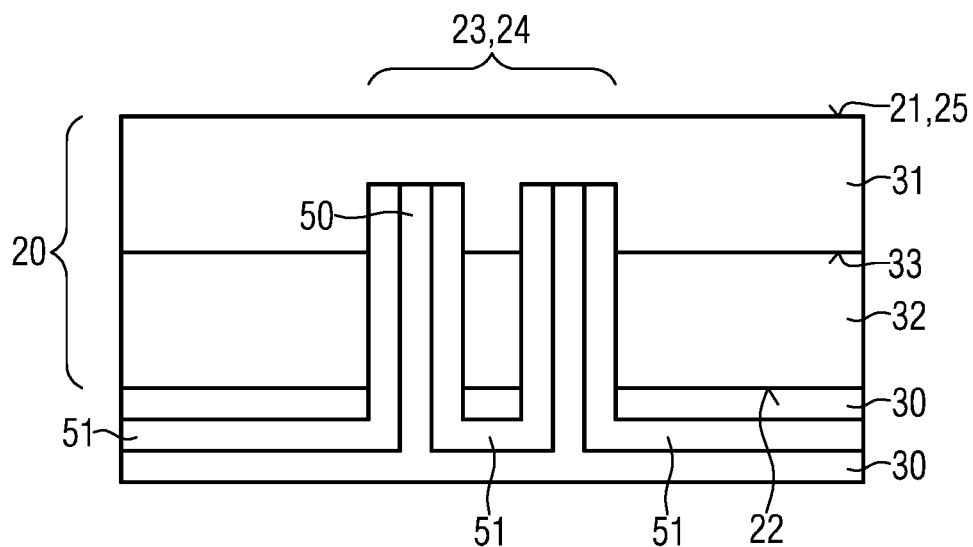
FIG. 4: shows an optoelectronic semiconductor chip having feed-throughs for contacting.

FIG. 4 shows a further possibility of establishing the emitting region 23 of an optoelectronic semiconductor chip 20. In this case, the upper layer 31 is contacted via feed-throughs 50. In this case, the two contact layers 30 are arranged on the lower side 22 and are electrically separated from one another by means of insulation 51. The feed-throughs 50 are contacted with the contact layer 30 facing away from the lower side 22. The feed-throughs 50 also include insulation 51, except for their ends. Typically, feed-throughs 50 may be provided in order to distribute current paths inside the optoelectronic semiconductor chip 20 as homogeneously as possible, in order to ensure uniform emission of electromagnetic radiation. A limited number of feed-throughs 50 may, on the other hand, be used to establish the emitting region 23. The emitting region 23 is substantially formed over the ends of the feed-throughs 50.

Figure 5:
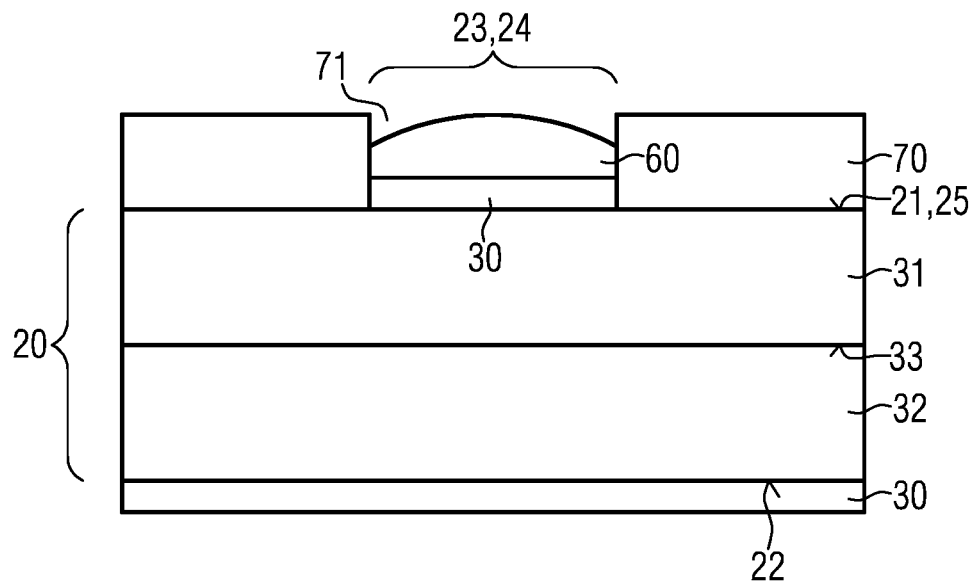
FIG. 5: shows an optoelectronic semiconductor chip having a nontransparent layer, which includes an opening in which a wavelength-converting material is arranged.

FIG. 5 shows a schematic side view of the variant, shown in FIG. 1, for establishing the emitting region 23 with additional elements. A nontransparent layer 70 is arranged on the upper side 21. The nontransparent layer 70 encloses the emitting region 23. Over the emitting region 23, the nontransparent layer 70 includes an opening 71. In the example shown in FIG. 5, a wavelength-converting material 60 is arranged in the opening 71.

The wavelength-converting material 60 is configured to modify the wavelength of the electromagnetic radiation emitted by the optoelectronic semiconductor chip 20. For example, the wavelength-converting material 60 may convert blue light into yellow light. Such conversion is carried out with a certain probability, so that originally emitted and converted light are emitted as white light by addition. The wavelength-converting material 60 may, for example, include a silicone or an epoxide with embedded wavelength-converting particles.

The wavelength-converting material 60 may for example be arranged over the emitting region 23 by dispensing, printing, spraying or by a sedimentation process. In the case of spraying of the wavelength-converting material 60, a mask may be used in order to spray the wavelength-converting material 60 in a controlled way into the opening 71 of the nontransparent layer 70. The wavelength-converting material 60 may, however, also be omitted if no wavelength conversion is intended.

The nontransparent layer 70 may, for example, include a metal and fulfills a plurality of functions. On the one hand, it functions as an aperture for the emitting region 23 and imparts sharper contours thereto. On the other hand, the nontransparent layer 70 limits the lateral extent of the wavelength-converting material 60. This is expedient since laterally directed scattering of electromagnetic radiation may take place inside the wavelength-converting material. The laterally directed scattering of electromagnetic radiation may be reduced by a restricted lateral extent of the wavelength-converting material 60. Furthermore, this effect may be minimized by a thickness of the wavelength-converting material 60 which is as small as possible. A thickness of the wavelength-converting material 60 may for example be 30 μm, the thickness may be less than 10 μm.

In another variant, the wavelength-converting material 60 may also be arranged in such a way that the wavelength-converting material 60 both is arranged over the emitting region 23 and laterally extends partially beyond the emitting region 23. In this case, a part of the wavelength-converting material 60 in the region of the opening 71 may also be arranged over the nontransparent layer 70 and laterally enclose the opening 71 of the nontransparent layer 70.

The case represented in FIG. 5, with a nontransparent layer 70 and a wavelength-converting material 60 arranged in the region of the opening 71 is not restricted to the variant of the optoelectronic semiconductor chip 20 which is shown in FIG. 1. Optoelectronic semiconductor chips 20 which are configured as represented in FIG. 2 to FIG. 4, may likewise be provided with a nontransparent layer 70 that includes an opening 71 over the emitting region 23, in the region of which the wavelength-converting material 60 may be arranged.

The nontransparent layer 70 may, however, also be omitted. In this case, for the reasons mentioned above, it is expedient to arrange the wavelength-converting material 60 only over the emitting region 23.

Figure 6:
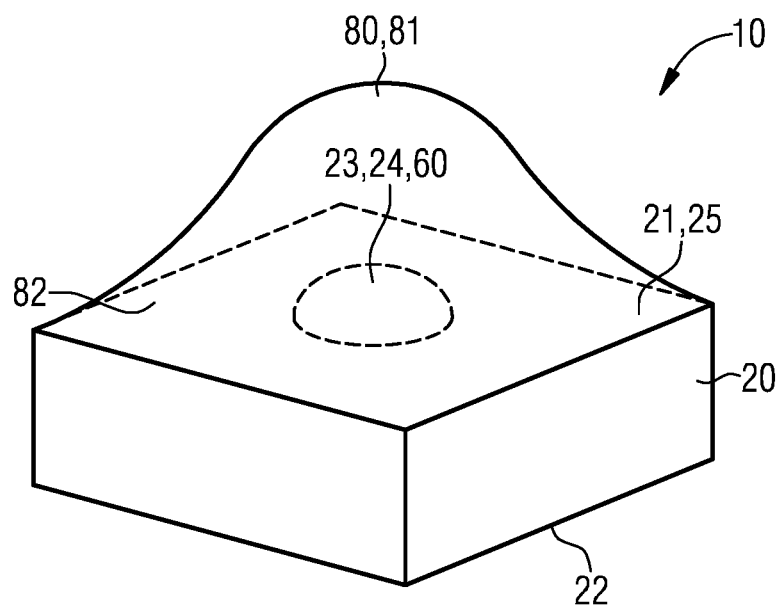
FIG. 6: shows a variant of an optoelectronic component having a lens as a collimating optical element.
Figure 7:
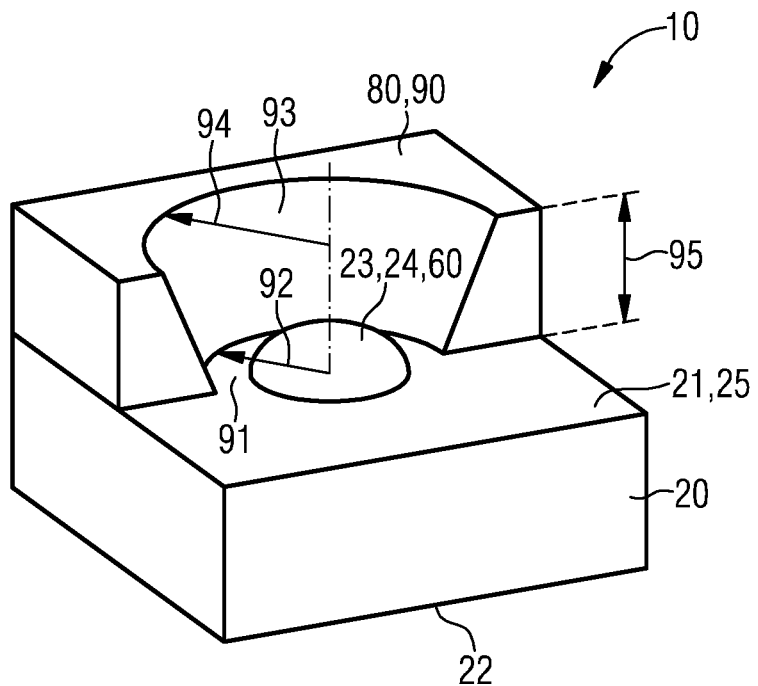
FIG. 7: shows a variant of the optoelectronic component having a reflector as a collimating optical element.
Figure 8:
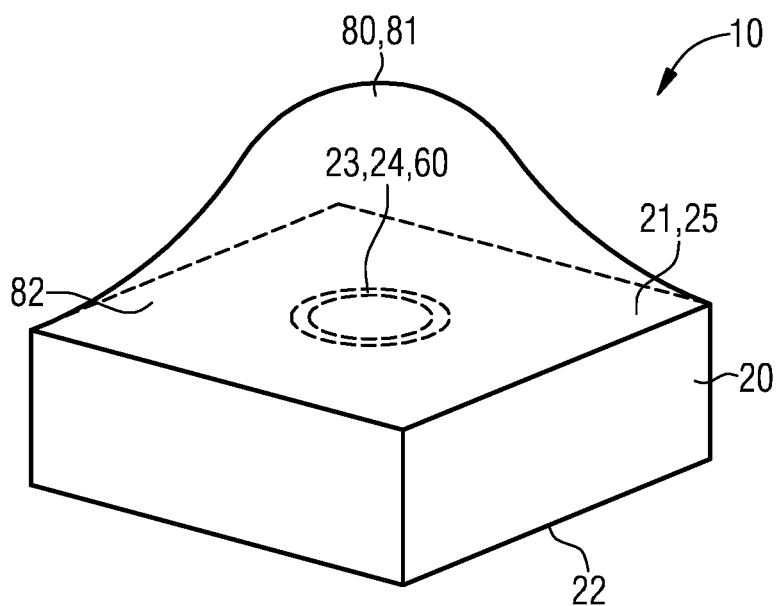
FIG. 8: shows a variant of the optoelectronic component having an annular emitting region.

FIG. 6 to FIG. 8 respectively represent variants of the optoelectronic component 10 in a schematic 3D view. For the sake of simplicity, the upper layer 31, the lower layer 32, the respective contact layers 30 and the nontransparent layer 70 are not shown. The optoelectronic semiconductor chips 20 shown in FIG. 6 to FIG. 8 may be configured like each of the variants shown in FIG. 1 to FIG. 4.

In the example shown in FIG. 6, the optoelectronic component 10 includes a lens 81 as a collimating optical element 80. The lens 81 is arranged over the emitting region 23 and covers the total surface 25 of the upper side 21 of the optoelectronic semiconductor chip 20. A lens surface 82, which is in contact with the upper side 21, is as large or substantially as large as the total surface 25 of the upper side 21 of the optoelectronic semiconductor chip 20. Here and in the rest of the context of the description, as already explained above, the lens surface 82 may be considered to be substantially as large as the total surface 25 of the upper side 21, if a deviation of the lens surface 82 relative to the total surface 25 of the upper side 21 is less than a deviation of the lens surface 82 from the subsurface 24, forming the emitting region 23, of the upper side 21.

The lens 81 may for example include a silicone and, for example, be arranged on the upper side 21 by a molding method, for example by compression molding. In a further variant (not represented) of the optoelectronic component 10, the lens 81 may also be arranged on a further layer, the further layer being arranged on the upper side 21 of the optoelectronic semiconductor chip 20. The further layer may, for example, include a silicone or an epoxide and have a refractive index which is less than a refractive index of the material forming the lens 81.

In the case represented, the lens 81 is shaped in such a way that it ensures forwardly directed collimation of electromagnetic radiation. The lens 81 may, however, also be provided in order to achieve annular collimation of electromagnetic radiation. In this case, the lens 81 includes a hollow facing away from the upper side 21. As an alternative or in addition, the emitting region 23 may be configured annularly for the purposes of annular collimation of electromagnetic radiation. An annularly configured emitting region 23 is shown in FIG. 8.

In the case of forwardly directed collimation, an area ratio between the subsurface 24, forming the emitting region 23, and the lens surface 82 may be estimated for a desired solid angle in which the electromagnetic radiation is intended to be emitted, by means of the etendue. The etendue refers to the extent of a beam of rays in geometrical optics. For the present case, the following applies for the etendue E:

$$E = \pi n^2 A \sin^2(\theta)$$

Here, n is the refractive index of the surroundings, A is a cross section of the beam of rays and $\theta$ is the aperture half-angle of the beam of rays. For the initial emission of electromagnetic radiation by the emitting region 23, with nLINSE=1.4 and with the assumption that electromagnetic radiation is emitted in the entire half-space ($\theta=90°$), the following is obtained for the etendue:

$$E \approx 2\pi A_{EMITTER}$$

As a result of the collimation of the electromagnetic radiation by the lens 81, with n=1, the following is obtained for the etendue:

$$E = \pi \sin^2(\theta) A_{LINSE}$$

If the beam of rays collimated by the lens 81 is intended to have an aperture half-angle of $\theta=45°$, the following is obtained for the etendue:

$$E = \tfrac{1}{2}\pi A_{LINSE}$$

Since the etendue is a conserved quantity, the following is obtained for the relationship between the surface of the emitting region 23 and the lens surface:

$$A_{LINSE} \geq 4 A_{EMITTER}$$

From this relationship, the reason why the subsurface 24, forming the emitting region 23, of the upper side 21 should be smaller than the total surface 25 of the upper side 21 is apparent. If the emitting region 23 were formed on the entire upper side 21, the lens surface 82 would have to be larger than the upper side 21 of the optoelectronic semiconductor chip 20. This is important particularly with a view to matrix arrangements of optoelectronic components 10.

It is expedient for the wavelength-converting material 60 to be arranged at a focus of the lens 81. As already explained above, in this way electromagnetic radiation from the region of the wavelength-converting material is collimated.

Besides lenses 81, nonimaging collimating optical elements 80 are also suitable for the collimation of electromagnetic radiation. FIG. 7 shows an optoelectronic component 10 having a reflector 90, only a part of the reflector 90 being represented in a schematic sectional view.

The reflector 90 may, for example, include a molding material having a reflective coating. The reflector 90 may, for example, be arranged on the upper side 21 by a molding method, for example by compression molding. The reflector 90 is likewise configured to collimate electromagnetic radiation. For annular collimation, the emitting region 23 may be again configured annularly.

The reflector 90 includes an opening 91, facing toward the emitting region 23, having a first radius 92, an opening 93, facing away from the emitting region 23, having a second radius 94 and a height 95 measured perpendicularly to the upper side 21. The second radius is at most as large as one half of an edge length of the optoelectronic semiconductor chip 20.

The reflector 90 may, for example, be a parabolically curved reflector 90. For a parabolically curved reflector 90, the following relationship applies:

$$h = (r+R)\cot(\theta)$$

Here, h is the height 95, r is the first radius 92, R is the second radius 94 and $\theta$ is the aperture half-angle of a beam of rays emitted by the parabolically curved reflector 90, which may also be referred to as the acceptance angle. For a beam of rays with $\theta=45°$, for example, the following relationship which may be used for the design of the parabolically curved reflector 90 applies:

$$h = r + R$$

Figure 9:
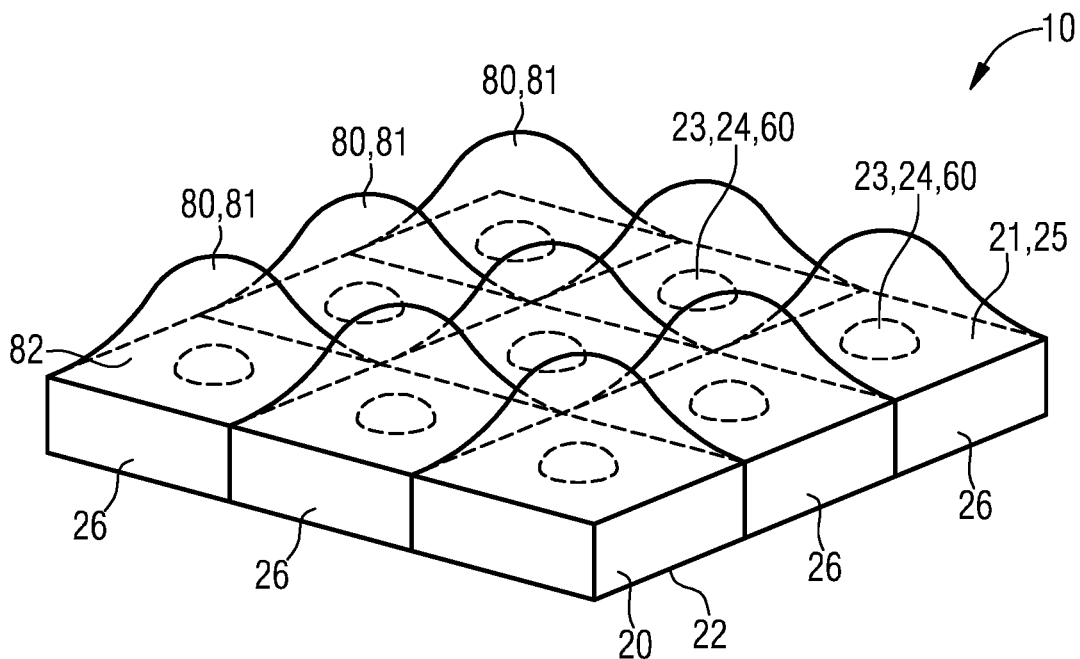
FIG. 9: shows a matrix arrangement of optoelectronic semiconductor chips having collimating optical elements.

FIG. 9 shows an optoelectronic component 10 having at least one further optoelectronic semiconductor chip 26, the further optoelectronic semiconductor chip 26 being configured like the optoelectronic semiconductor chip 20. The optoelectronic semiconductor chips 20, 26 may in this case also be referred to as pixels. In the example represented, a matrix arrangement of 3×3 pixels is shown. The matrix arrangement may, however, include an arbitrary number of pixels, and the matrix arrangement may for example include 4000×4000 pixels.

Figure 10:
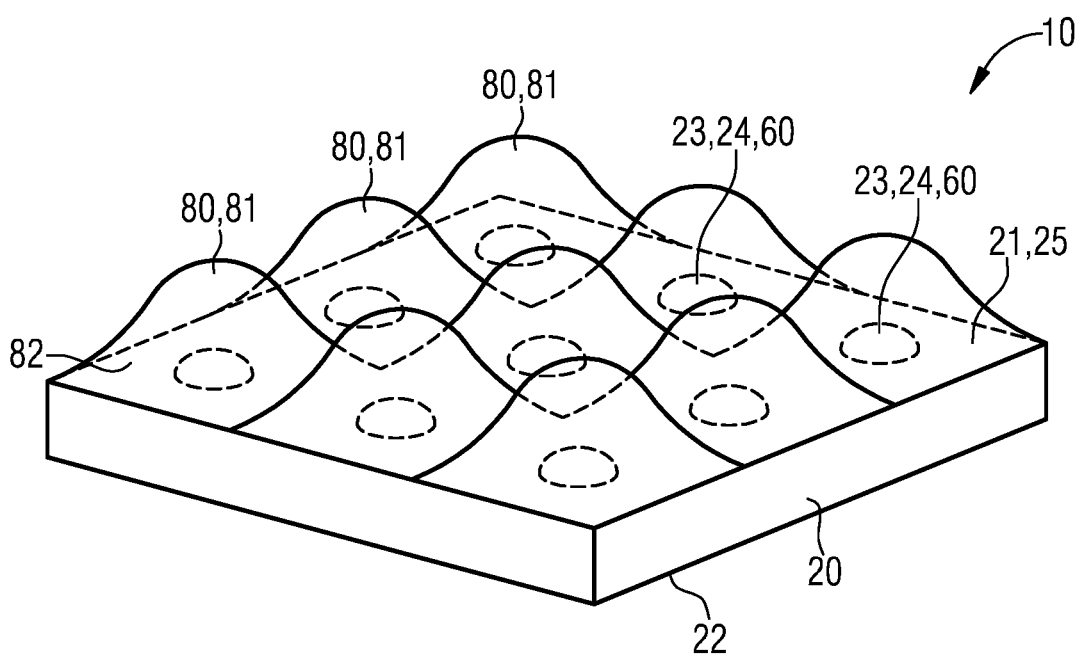
FIG. 10: shows a multiplicity of emitting regions formed on an upper side of an optoelectronic semiconductor chip.

In FIG. 9, each emitting region 23 is formed respectively on an optoelectronic semiconductor chip 20. This, however, is not absolutely necessary. The optoelectronic component 10 may also include only one optoelectronic semiconductor chip 20. This is represented in FIG. 10. In this case, a multiplicity of emitting regions 23 are formed on the upper side 21 of the optoelectronic semiconductor chip 20. In order to arrange a multiplicity of emitting regions 23 on the upper side 21 of an optoelectronic semiconductor chip 20, the methods shown in FIG. 1 to FIG. 4 may be used.

For the case of a matrix arrangement of pixels, as is shown in FIG. 9 and FIG. 10, a nontransparent layer 70 having openings 71 over the emitting regions 23 may additionally increase the contrast of the optoelectronic component 10. Side walls of the openings 71, in which the wavelength-converting material 60 may be arranged, may additionally be reflectively configured in order to increase the contrast.

In the variants of the optoelectronic component 10 shown in FIG. 9 and FIG. 10, lenses 81 respectively arranged over the emitting regions 23. Instead of the lenses 81, however, reflectors 90 may also be arranged over the emitting regions 23. The emitting regions 23 may also be configured annularly, as is shown in FIG. 8.

Figure 11:
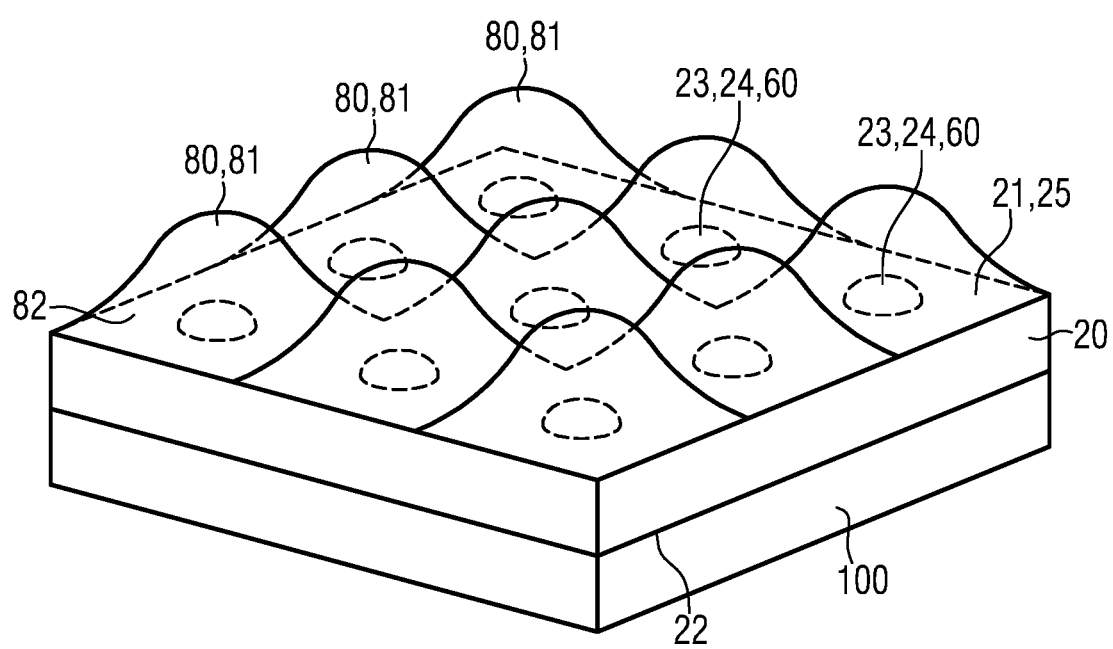
FIG. 11: shows an optoelectronic component corresponding to FIG. 10, the optoelectronic component being arranged on an integrated circuit.

Each emitting region 23 of the multiplicity of emitting regions 23 of the optoelectronic component 10, which as represented in FIG. 9 and FIG. 10 may be formed over the upper sides 21 of a multiplicity of optoelectronic semiconductor chips 20, 26 or over only one upper side 21 of a single optoelectronic semiconductor chip 20, may advantageously be driven separately, i.e. each emitting region 23 may be supplied individually with electrical energy for operation. This is represented in FIG. 11. By way of example, in this case the multiplicity of emitting regions 23 are formed over the upper side 21 of an optoelectronic semiconductor chip 20. The optoelectronic semiconductor chip 20 is arranged on an integrated circuit 100 (IC). The integrated circuit 100 is configured to supply each individual emitting region 23 separately with electrical energy.

An optoelectronic component 10 may, for example, be a front headlamp of an automobile. The optoelectronic component 10 may in this case, for example, be configured to generate light distributions useful for road traffic. For example, it is possible for a light distribution to be configured in such a way that the oncoming traffic is dazzled as little as possible.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes that come within the meaning and range of equivalency of the claims are therefore intended to be embraced.

LIST OF REFERENCES 10 optoelectronic component
20 optoelectronic semiconductor chip
21 upper side of the optoelectronic semiconductor chip
22 lower side of the optoelectronic semiconductor chip
23 emitting region
24 subsurface, forming the emitting region, of the upper side
25 total surface of the upper side
26 further optoelectronic semiconductor chips
30 contact layer
31 upper layer of the optoelectronic semiconductor chip
32 lower layer of the optoelectronic semiconductor chip
33 interface between upper and lower layers
40 current path-limiting layer
41 opening of the current path-limiting layer
42 opening area of the opening
50 feed-through
51 insulation
60 wavelength-converting material
70 nontransparent layer
71 opening of the nontransparent layer
80 collimating optical element
81 lens
82 lens surface
90 reflector
91 opening of the reflector facing toward the emitting region
92 first radius
93 opening of the reflector facing away from the emitting region
94 second radius
95 height of the reflector measured perpendicularly to the upper side
100 integrated circuit

The invention claimed is:

1. An optoelectronic component comprising:
an optoelectronic semiconductor chip comprising:
an upper side comprising a subsurface forming an emitting region formed thereon; wherein the emitting region is configured to emit electromagnetic radiation; and wherein the subsurface is smaller than a total surface of the upper side;
a lower side;
a collimating optical element arranged over the emitting region, on the upper side of the optoelectronic semiconductor chip,
wherein a contact layer is arranged on the upper side or on the lower side, wherein an area covered by the contact layer is substantially as large as the subsurface, forming the emitting region, of the upper side, wherein a lateral position of the area covered by the contact layer is substantially identical to a lateral position of the emitting region.

2. The optoelectronic component as claimed in claim 1, wherein the area covered by the contact layer is raised relative to an uncovered region of the upper side, or relative to an uncovered region of the lower side.

3. The optoelectronic component as claimed in claim 1, wherein the optoelectronic semiconductor chip further comprises at least one current path-limiting layer embedded in the optoelectronic semiconductor chip, wherein the current path-limiting layer comprises an opening, wherein an electrical conductivity of the current path-limiting layer is less than an electrical conductivity of the optoelectronic semiconductor chip in the region of the opening of the current path-limiting layer, wherein the opening is formed below the emitting region in a vertical direction relative to the upper side, wherein an opening area of the opening is substantially as large as the area of the emitting region.

4. The optoelectronic component as claimed in claim 3, wherein the collimating optical element is a lens; and wherein the wavelength-converting material is arranged at a focus of the lens.

5. The optoelectronic component as claimed in claim 1, wherein a wavelength-converting material is arranged over the emitting region.

6. The optoelectronic component as claimed in claim 5, wherein a nontransparent layer is arranged on the upper side,
wherein the nontransparent layer comprises an opening over the emitting region, wherein the wavelength-converting material is arranged in the region of the opening.

7. The optoelectronic component as claimed in claim 1, wherein the collimating optical element is a lens.

8. The optoelectronic component as claimed in claim 7, wherein a lens surface of the lens is in contact with the upper side (21), wherein the lens surface is as large or substantially as large as the total surface of the upper side of the optoelectronic semiconductor chip.

9. The optoelectronic component as claimed in claim 8, wherein the subsurface is at most as large as one fourth of an area of the lens.

10. The optoelectronic component as claimed in claim 1, wherein the collimating optical element is a reflector, wherein the reflector comprises an opening having a first radius facing toward the emitting region, wherein the reflector comprises an opening having a second radius facing away from the emitting region, and wherein the reflector comprises a height measured perpendicularly to the upper side, wherein the second radius is at most as large as one half of an edge length of the optoelectronic semiconductor chip.

11. The optoelectronic component as claimed in claim 1, wherein the emitting region is configured annularly.

12. The optoelectronic component as claimed in claim 1, wherein a multiplicity of emitting regions comprises the emitting region, wherein a collimating optical element is arranged at least over one emitting region of the multiplicity of emitting regions.

13. The optoelectronic component as claimed in claim 12, wherein the multiplicity of emitting regions are driven separately.

14. The optoelectronic component as claimed in claim 1, further comprising at least one further optoelectronic semiconductor chip, wherein the at least one further optoelectronic semiconductor chip is configured in the same way as the optoelectronic semiconductor chip.

\* \* \* \* \*